United States Patent [19]

Morimoto et al.

[11] Patent Number: 4,581,113
[45] Date of Patent: Apr. 8, 1986

[54] PROCESS FOR FORMING AN AMORPHOUS SILICON FILM

[75] Inventors: Kiyoshi Morimoto, Mobara; Toshinori Takagi, Nagaokakyo, both of Japan

[73] Assignee: Futaba Denshi Kogyo K.K., Mobara, Japan

[21] Appl. No.: 246,075

[22] Filed: Mar. 20, 1981

[30] Foreign Application Priority Data

Mar. 31, 1980 [JP] Japan .................................. 55-40440

[51] Int. Cl.$^4$ ............................................ H01L 45/00
[52] U.S. Cl. ..................................... 204/192 N; 427/39; 427/86; 357/2
[58] Field of Search ............... 204/192 N; 427/39, 86; 357/2

[56] References Cited

U.S. PATENT DOCUMENTS 4,151,058 4/1979 Kaplan et al. .................... 204/192 S
4,152,478 5/1979 Takagi ................................... 428/221
4,227,961 10/1980 Takagi ................................... 156/608

FOREIGN PATENT DOCUMENTS

WO79/00724 10/1979 PCT Int'l Appl. .

OTHER PUBLICATIONS

S. R. Ovshinsky, Amorphous Semiconductors Equivalent to Crystalline Semiconductors.

Primary Examiner—Veronica O'Keefe
Attorney, Agent, or Firm—Oblon, Fisher, Spivak, McClelland & Maier

[57] ABSTRACT

A process for forming an amorphous silicon film consisting of silicon (Si) and hydrogen (H) bonded in a monohydride state by a cluster ion beam deposition which comprises the step of impinging ionized and non-ionized silicon (Si) and hydrogen (H) upon a substrate within a vacuum chamber in which hydrogen is maintained at a pressure of about $10^{-2}$ Torr or less.

4 Claims, 10 Drawing Figures (×10,000)

(×5,000)

PROCESS FOR FORMING AN AMORPHOUS SILICON FILM

BACKGROUND OF THE INVENTION

1. Field of the Invention

This invention relates generally to a process for forming a silicon film, and more particularly to a process for forming an amorphous silicon film having excellent electrical and thermal properties.

2. Description of the Prior Art

Semiconductor material used heretofore for fabricating semiconductor devices are generally single crystal. A method of manufacturing such a semiconductor device comprises the steps of fabricating a single crystal semiconductor ingot by a pulling method, slicing the ingot in a sheet to obtain a wafer, and doping impurities in the wafer to form semiconductor elements or epitaxially growing predetermined semiconductor materials on the wafer by liquid or vapor phase epitaxy to form single crystal semiconductor layers.

The fabrication of the single crystal semiconductor requires several process, and also tremendous efforts must be exerted for processing the semiconductor materials in the single crystal. Furthermore, the single crystal ingot fabricated by the process explained hereinabove includes many crystal defects at the periphery thereof and can not be used as a material for manufacturing the semiconductor device. In addition, it is necessary to prepare lots of single crystal semiconductor materials to produce one semiconductor device, because the ingot must have a certain thickness so that it may be sliced in a wafer. Accordingly, the semiconductor device using the single crystal semiconductor material is disadvantageous in that the cost of the wafer or the device itself becomes expensive.

Recently, several attempts have been made to produce semiconductor devices without using single crystal semiconductor materials as a result of extensive researches as to the materials for fabricating these devices. One of these attempts is to produce amorphous substances by depositing component elements on a substrate by vapor evaporation or sputtering processes so that they may be used as a semiconductor material. If the amorphous substances can be used as the semiconductor material, it is possible to make use of inexpensive materials, such as, for example, glass or stainless steel, as a substrate. In addition, the amorphous substances have a large absorption coefficient. Accordingly, an optical device could be produced with less amount of the material and its manufacturing process could be remarkably simplified. Although the semiconductor device made of the amorphous substance is inferior in its characteristics as compared with those of the single crystal semiconductor device, the amorphous substance is appealing, because the device can be produced at a reduced cost and the manufacturing process can be simplified.

The single crystal substance has both long and short distance orders in its atom distribution, while the amorphous substance has the short distance order and does not have the long distance order. In other words, the amorphous substance consists of an unsaturated bond, namely, a dangling bond which lacks connection in covalent bond in several atom orders, and includes a number of dislocations. Thus, the electron state of the amorphous substance is in a band tail state which lacks a clear width in state density of the electrons and also in a mid gap state having deep localized level, which makes it difficult to effect doping for determining conductivity type of the semiconductor and to control valence electron.

In order to eliminate the dangling bond explained hereinabove, several attempts have been made. One of the attempts is to form the amorphous silicon film on a substrate by a glow discharge method which decomposes silicon hydride, such as, for example, monosilane ($SiH_4$) gas, in high frequency electric field (several hundreds to several $MH_z$).

FIG. 1 schematically illustrates a method of producing the amorphous silicon film. The amorphous silicon film is produced by introducing the $SiH_4$ gas having a pressure of 0.1 Torr to several Torr in a vessel 2 which contains a substrate 1 and is wound by a high frequency coil 3, and supplying high frequency electric power to the high frequency coil 3 thereby to produce glow discharge around the substrate 1 and generate plasma 4 of $SiH_4$. Silicon and hydrogen decomposed in the plasma 4 are accumulated on the substrate 1 which is heated at an appropriate temperature, for instance, 200° C. to 350° C., and an amorphous silicon 5 is formed on the substrate 1.

This glow discharge process is intended to eliminate the dangling bond by making the amorphous silicon 5 contain a large volume of hydrogen, thereby to dissolve the mid gap state, namely, the deep localized level between the band.

On the other hand, the band tail state can be diminished by creating a bond between silicon and silicon in the amorphous silicon 5 as much as possible. This can be done by increasing the heat temperature of the substrate 1 shown in FIG. 1. However, if the heat temperature is raised, hydrogen can not be injected into the amorphous silicon and the dangling bond can not be eliminated. Accordingly, in the glow discharge process, improvements in the band tail state can not be expected too much. Furthermore, the amorphous silicon produced by the glow discharge process is thermally unstable and variable in its electric characteristics, because it contains a large volume of hydrogen which is generally 10 to 20 atom % and permits hydrogen to escape if the substrate is heated up to the temperature of above 200° C., thereby placing the amorphous silicon in the initial mid gap state.

This can be proved by measurement of optical band gap for regulating band gap of amorphous substance. The broken line (a) in FIG. 2 shows variation of the optical band gap when the amorphous silicon formed by the glow discharge process is annealed at a different temperature. As is apparent, the optical band gap decreases when the anneal temperature exceeds 200° C., which results in variation of the electric characteristics. The broken line (a) in FIG. 3 shows conductivity of the amorphous silicon film at the respective anneal temperatures which is formed by the glow discharge process, and it can be recognized that the electric conductivity of the amorphous silicon film is variable depending upon the anneal temperature. The variation of the electric conductivity is resulted from the escape of hydrogen saturated in the dangling bond due to the heating, and the escape of hydrogen increases the mid gap state which is acted as an electron capture level and decreases the electric conductivity.

As explained hereinabove, the amorphous silicon film produced by the prior art process is defective, because it is thermally unstable and easy to deteriorate its electric characteristics. The instability of the conventional amorphous silicon film can be proved by an examination of bond structure of Si-H by infrared absorption measurement. In the amorphous silicon film formed by the conventional glow discharge process, a peak of absorption coefficient detected by the infrared absorption measurement exists at the points of both wave numbers 2000 cm$^{-1}$ and 2100 cm$^{-1}$ of incident infrared rays. When the absorption coefficient has the peak at the point of 2000 cm$^{-1}$, it is recognized from the relation between infrared absorption characteristics and the bond structure which is already known in the art that the bond structure is in a monohydride state connecting one hydrogen atom to any one of the silicon atoms and eliminating the dangling bond as schemtically illustrated in the structural formula of FIG. 4. When the absorption coefficient has the peak at the point of the wave number 2100$^{-1}$, the bond structure is in a dihydride state connecting two hydrogen atoms to any one of silicon atoms and eliminating the dangling bond as shown in FIG. 5. Thus, in the conventional amorphous silicon film, there are a plenty of the dihydride bond structures in addition to the monohydride bond structures. The dihydride state is considered to be unstable, because hydrogen easily escapes from the bond structure. The instability of the amorphous silicon film can be proved from the bond structure as explained hereinabove. Because of the instability of the characteristics of the amorphous silicon, it has not yet been put to practical use in spite of being recognized for its numerous advantages with respect to the manufacturing cost and the production process for the semiconductor device.

SUMMARY OF THE INVENTION

In the light of the foregoing circumstances, the inventors have made extensive research and experimentation to produce a high quality amorphous silicon film which is thermally and electrically stable, and finally accomplished this invention based on findings that the amorphous silicon film which is thermally stable and excellent in electric characteristics can be produced by a cluster ion beam deposition process.

Accordingly, it is an object of the present invention to provide a process for forming an amorphous silicon film which is thermally and electrically stable and does not change in its electrical and optical characteristics even if it is used in an environment where there is tremendous temperature fluctuation.

It is another object of the present invention to provide a process for forming an amorphous silicon film which is excellent in packing density and has strong adhesion force with respect to a substrate.

It is another object of the present invention to provide a process for forming an amorphous silicon film which is capable of controlling valence electrons by doping and is applicable for producing various semiconductor devices, such as for example, solar cells, imaging devices, memory elements, or various IC elements.

Briefly, the foregoing and other object are attained by providing a process for forming an amorphous silicon film which comprises the steps of heating and vaporizing silicon in a closed type crucible with at least one injection nozzle to form silicon vapor, ejecting the silicon vapor through the injection nozzle into a hydrogen atmosphere the pressure of which is kept at about 10$^{-2}$ Torr or less to expand adiabatically the silicon vapor so as to attain a supercooled state and form clusters comprising atoms of the silicon vapor, ionizing at least one atom forming the clusters by bombarding the clusters with electrons to produce ionized clusters, and permitting the ionized clusters and hydrogen to collide with a substrate surface with kinetic energy imparted to the clusters at the time of the ejection from the nozzle. According to the cluster ion beam deposition process for forming the amorphous silicon film of the present invention, migration effect on the substrate surface, ion injection effect, and ionization effect of silicon can be expected, which make it possible to produce the amorphous silicon film of excellent quality. The amorphous silicon film according to the present invention is thermally and electrically stable and is abundant in silicon-to-silicon bonds. Furthermore, dangling bonds can be prevented by introducing a lesser amount of H$_2$, and both the band tail state and the mid gap state can be eliminated. The bond structure of Si-H in the amorphous silicon film is of a monohydride state.

BRIEF DESCRIPTION OF THE DRAWINGS

The exact nature of this invention, as well as other objects and advantages thereof, will be readily apparent from consideration of the following specification relating to the annexed drawings in which.

DESCRIPTION OF THE PREFERRED EMBODIMENTS

A process for forming an amorphous silicon film according to an embodiment of the present invention will now be described in connection with the accompanying drawings. First, reference will be made to a cluster ion beam deposition process.

The cluster ion beam deposition process comprises the steps of heating and vaporizing a film material in a closed type crucible with at least one injection nozzle to form vapor of the film material, ejecting the vapor through the injection nozzle into a high vacuum region the pressure of which is kept at 1/100 or less of the vapor pressure in the crucible, to expand adiabatically the vapor at the time of the ejection from the nozzle so as to attain a supercooled state and form aggregates or clusters comprising 100 to 2,000 atoms of the vapor loosely coupled by Van der Waals force, ionizing at least one atom forming the clusters by bombarding the clusters with electrons to produce ionized clusters, accelerating the ionized clusters by means of an electric field if necessary, and permitting the ionized clusters to collide with a substance with kinetic energy imparted to the clusters at the time of the ejection from the nozzle thereby forming a film deposited thereon. In the cluster ion beam deposition process, the material to be grown on the substrate can be controlled in an amorphous, polycrystalline, or single crystalline state at will by setting substrate temperature, vaccuum degree in the environmental space of the crucible, ionization rate of the clusters, and acceleration voltage for the ionized clusters in any appropriate value. Furthermore, it is possible to form a compound thin film by positioning at least two crucibles in the vacuum region each of which contains a different component element or introducing reactive gas into the region where the clusters are to be formed. This invention is directed to a process for forming an amorphous silicon film using the cluster ion beam deposition process explained hereinabove.

Figure 6:
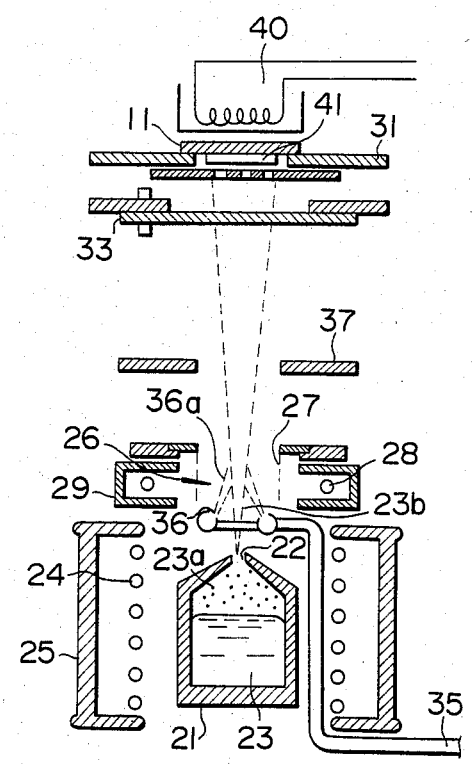
FIG. 6 is a schematical diagram of an apparatus for use in forming an amorphous silicon film according to an embodiment of the present invention.

The process for forming the amorphous silicon film according to the present invention is conducted by using an apparatus shown in FIG. 6.

The apparatus shown in FIG. 6 includes a closed type crucible 21 having at least one nozzle 22, which in this example is between 0.5 mm and 2.0 mm in diameter. The thickness of the nozzle 22 in the axial direction is as small as possible, preferably thinner than the diameter of the nozzle 22, so that the aspect ratio becomes less than 1. The crucible 21 contains silicon 23, which is subjected to a pulverized treatment and is introduced into the crucible.

The crucible is surrounded by a heater 24. In the embodiment shown in FIG. 6, the heater 24 operates by electron bombardment, and comprises a coiled filament for emitting electrons. The crucible 21 is maintained at a positive potential relative to the filament, by means of a power source (not shown), thereby accelerating the electrons emitted from the filament so that they impinge upon the crucible surface at high velocity, to produce heating of the crucible 21. A thermal shielding plate 25 surrounds the heater 24. In a possible alternative arrangement for heating the crucible 21, the crucible is made of an electrically conductive material, terminals are provided on upper and lower parts of the crucible 21, and the crucible 21 is then heated by passing a high current (at low voltage) through the crucible 21 so as to heat the entire crucible 21. As a further alternative, the crucible 21 can be heated by radiation heating, with a heater disposed around the crucible 21. A combination of more than one of these heating methods may be used.

An ionization chamber 26 is provided above the crucible 21. Around the ionization chamber, there is provided an arrangement for generating ionizing electrons comprising a filament 28 enclosed within a shield 29, and a reticular anode 27 forming the outer limits of the ionization chamber. In plan view, the anode 27 is circular, although it may have any of a variety of other shape, such as polygons.

A holder 31 is provided to hold a substrate 11, such as, for example, glass, on which an amorphous silicon film 41 is deposited. Also, a shutter 33 is provided to allow the substrate 11 to be shielded from the jets of Si or $H_2$.

Numeral 35 designates a hydrogen supply pipe having at least one nozzle 36. In the embodiment shown in FIG. 6, the nozzle 36 is disposed in the vicinity of the nozzle 22 of the crucible 21, however, the nozzle 36 may be provided adjacent to the substrate 11. An annular acceleration electrode 37 to which a negative potential relative to the crucible 21 is applied by a power source (not shown) for accelerating ionized silicon vapor may be provided between the ionization chamber 26 and the substrate 11. Also, a heater 40 may be provided to maintain the substrate 11 at the correct temperature, if required.

The apparatus shown in FIG. 6 is all enclosed in a vacuum chamber (not shown), together with the substrate 11 on which the amorphous silicon film 41 is to be formed and the chamber is evacuated at a high vacuum state in the order of at least $10^{-5}$ Torr. In this state, hydrogen 36$a$ is supplied to the vacuum chamber from the nozzle 36 through the hydrogen supply pipe 35, and the pressure within the vaccuum chamber is maintained between $10^{-6}$ and $10^{-3}$ Torr.

The pressure of hydrogen 36$a$ supplied to the vacuum chamber should be such that flight range of silicon clusters formed by adiabatic expansion due to the ejection into the vacuum chamber from the nozzle 22 of the crucible 21 and mean free path of the electrons emitted from the filament 28 with respect to hydrogen ($H_2$) are equal to working space or longer than the working space. As a matter of fact, the pressure of less than $10^{-3}$ Torr is preferable. In the present invention, the pressure of $H_2$ introduced into the vacuum chamber is extremely low. This is one of the characteristics of the present invention and is a contrast to the prior art process. In the conventional glow discharge process for forming amorphous silicon film, it is required to supply $H_2$ to the vessel, the pressure of which is at least 0.1 Torr to several Torr depending upon conditions in order to generate glow discharge. Accordingly, in the present invention, unnecessary hydrogen is not introduced into the amorphous silicon film to be formed, which allows the amorphous silicon to be extremely stable.

Although the substrate 11 may not be heated, the heating of the substrate to some extent is preferable for improving the band tail state. The heating temperature in this instance is approximately 200° C. or less than 400° C., which does not damage the probability of capture of hydrogen in the amorphous silicon film.

When operating the apparatus shown in FIG. 6, the heater 24 is actuated to heat the crucible 21 for melting silicon filled in the crucible 21 and generating silicon vapor 23$a$ within the crucible 21. The temperature for heating silicon is determined based on environmental space around the crucible 21, namely, the pressure within the vacuum chamber which can be expressed as $P/Po \geq 10^{-2}$, preferably $P/Po \geq 10^{-4}$, in which P represents the vapor pressure of silicon within the crucible 21 and Po represents the pressure within the vacuum vessel. For instance, the vapor pressure P is maintained at approximately $10^{-3}$ Torr at the heating temperature of 1470° C. and approximately 1 Torr at the heating temperature of 2060° C., because the melting point of silicon is 1415° C. Accordingly, the heating temperature of 1400° C. to 2100° C. is sufficient when the pressure within the vacuum vessel is $10^{-5}$ Torr to $10^{-3}$ Torr. The heating temperature may be increased up to about 2300° C. so that the vapor pressure P may be increased to enhance the speed of the film formation.

The silicon vapor 23a is ejected from the nozzle 22 to the outside of the crucible 21 due to the pressure difference between the crucible 21 and the vacuum vessel. The ejected vapor is imparted with kinetic energy corresponding to the ejection velocity and directed toward the substrate 11 in the form of vapor stream 23b. In this instance, if the vapor is forced into a supercooled state due to the adiabatic expansion at the time of ejecting from the nozzle 22 by changing the shape of the nozzle 22 and the pressures P and Po so as to meet the conditions explained hereinabove, or modifying the shape of the nozzle 22 of the crucible 21, it is possible to have a part of the ejected vapor 23a converted into clusters which are large aggregates of the vapor of silicon atoms or moleculars loosely coupled by Van der Waals force.

The vapor stream 23b imparted with the kinetic energy due to the ejection from the crucible 21 is passed through the ionization chamber 26 where at least a part of the vapor stream is ionized. The ionization of the vapor 23b is effected in such a manner that electrons emitted from the filament 28 when energized and heated are accelerated at the voltage of 100–1,000 V which is applied between the filament 28 and the reticular anode 27 and then impinged upon the vapor stream 23b passing through the reticular anode 27. When the vapor stream 23b of silicon spouted from the nozzle 22 is in the form of the clusters, at least one of the atom groups constituting each cluster is ionized in the ionization chamber 26 by the electron bombardment, thereby to form cluster ions. For instance, if the ionization current is 100 mA, the clusters are ionized approximately at ten percent (10%) and converted into the cluster ions.

The ionized silicon atoms and the non-ionized neutral silicon atoms or the silicon clusters and the cluster ions, while involving hydrogen in the route of the vapor stream 23b, are directed toward the substrate 11, and, when the shutter 33 is open, the vapor stream 23b is brought into collision with the surface of the substrate 11 to form the amorphous silicon film 41 thereon. When impinging the silicon clusters upon the surface of the substrate 11, the clusters are broken up into the individual atoms, and migrate on the surface of the substrate 11 together with atomic particles of silicon directly striking the substrate 11. As a result, a bond between silicon and silicon is promoted due to the surface migration effect and the ionization effect inherent in the silicon ions in the partially ionized silicon atoms.

Figure 4:
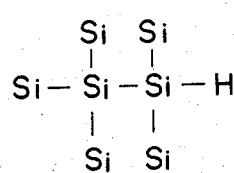
FIG. 4 is a schematic illustration of the structral formula of an amorphous silicon film which is in a monohydride state.
Figure 5:
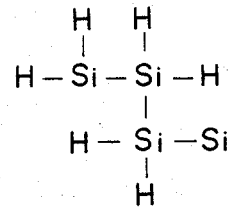
FIG. 5 is a schematic illustration of the structural formula of an amorphous silicon film which is in a dihydride state.

Similarly, hydrogen (H$_2$) introduced into the vacuum vessel is partially ionized by the electron bombardment or subjected to be in a simple atom (H), and is brought into collision with the substrate 11 together with the vapor stream 23b of silicon. Then, hydrogen (H$_2$) is activated and migrates on the surface of the substrate 11 in the same manner as silicon. The activated hydrogen (H) is combined in silicon which is being bonded while migrating on the surface of the substrate, thereby forming the amorphous silicon film 41 having the structure which saturates the dangling bond with H. In the amorphous silicon film of the present invention, the bond between silicon and silicon is dominant due to the migration effect and the ionization effect, and silicon is bonded in a middle distance order rather than a short distance order. As shown in the structural formula of FIG. 4, hydrogen (H) is bonded to the silicon atom which is isolated from the silicon-to-silicon bond and is in the dangling bond. Accordingly, the monohydride state is dominant in the bond state of Si-H and the stable amorphous silicon film can be prepared.

Figure 7:
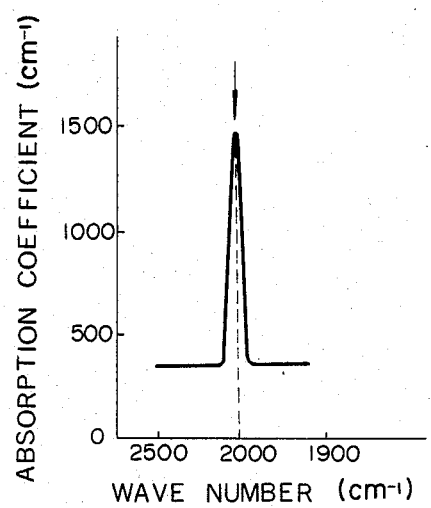
FIG. 7 is a graph of the ultrared absorption coefficient as a function of wave number for an amorphous silicon film of the present invention.

This can be proved by subjecting the amorphous silicon film 41 to an ultrared absorption measurement. FIG. 7 shows the ultrared absorption coefficient as a function of wave number for the amorphous silicon film formed by the cluster ion beam deposition process which comprises the steps of evacuating the vacuum vessel at a high vacuum state in the order of at least $10^{-6}$ Torr, introducing hydrogen (H$_2$) into the vacuum vessel, maintaining the pressure of hydrogen in the order of $4 \times 10^{-5}$ Torr, and depositing silicon on the substrate 11. The heat temperature of the substrate 11 at the time of effecting the vapor evaporation is 200° C., the ionization current is 100 mA, and the acceleration voltage applied to the acceleration electrode 37 is 3 KV. According to the measurement, the peak in the ultrared absorption spectrum can be recognized only at the wave number 2000 as shown in FIG. 7, which indicates that silicon and hydrogen in the amorphous silicon produced by the method of the present invention are bonded in the monohydride state. Furthermore, the vapor stream 23b of silicon is impinged upon the substrate 11 with kinetic energy imparted at the time of the ejection from the nozzle. Therefore, the resultant amorphous silicon film 41 is strongly adhered to the substrate 11 due to the injection energy and increases its packing density.

In the present invention, the ionization rate of the vapor stream 23b of silicon can be controlled by regulating the acceleration voltage applied to the anode 27 so as to change the ionization current extracted from the filament 28, thereby controlling various characteristics of the amorphous silicon film 41 to be deposited on the substrate 11. Moreover, it is possible to make the bond between silicon and silicon increase and the middle distance order dominate by regulating the acceleration voltage applied to the acceleration electrode 37, for example, within the extent of 0 to 5 KV. The middle distance order dominates as the acceleration voltage increases. This can be achieved by increasing the temperature of the substrate 11 by means of the heater 40. The temperature of the substrate for forming the amorphous silicon film may be 450° C. at most.

Figure 8:
FIG. 8 is an electron micrograph showing the surface of an amorphous silicon film of the present invention.
Figure 9:
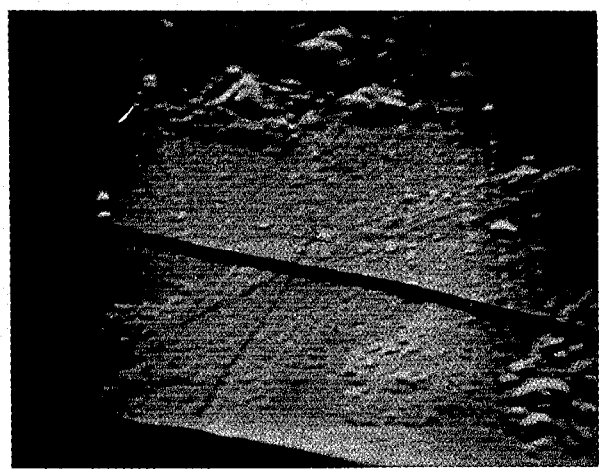
FIG. 9 is an electron micrograph showing the surface of an amorphous silicon film prepared by the conventional vacuum evaporation process.

FIG. 8 is an electron micrograph showing the surface of the amorphous silicon film thus produced. As is apparent from FIG. 8, the surface of the amorphous silicon film produced by the process of the present invention is extremely smooth, which is a contrast to the surface of the amorphous silicon film produced by the conventional vaccuum evaporation shown in FIG. 9.

Figure 1:
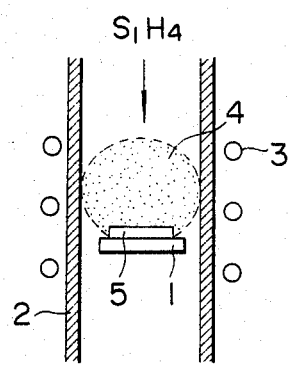
FIG. 1 is a schematic illustration of the conventional process for forming an amorphous silicon film.
Figure 2:
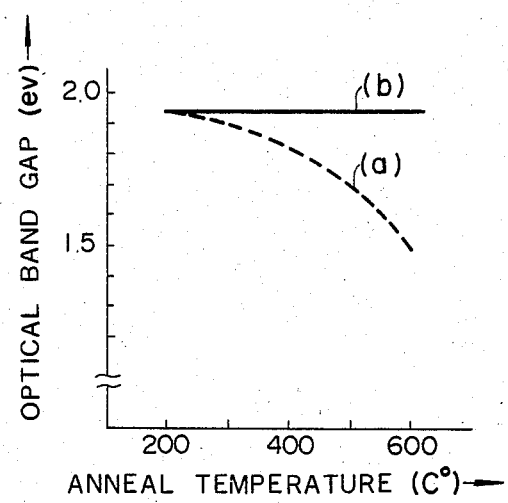
FIG. 2 is a graph of the optical band gap as a function of applied anneal temperature for amorphous silicon films produced by the conventional process and the process of the present invention.
Figure 3:
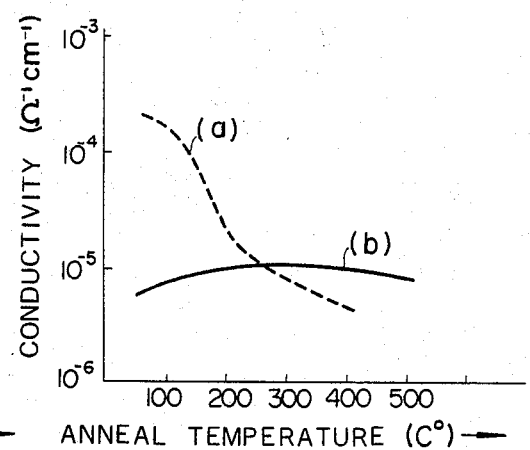
FIG. 3 is a graph of the electric conductivity as a function of applied anneal temperature for amorphous silicon films produced by the conventional process and the process of the present invention.

Referring now to characteristics of the amorphous silicon film produced by the apparatus shown in FIG. 6, the solid line (b) in FIG. 2 shows the variation of optical band gap when the amorphous silicon film of the present invention is annealed at a different temperature. As is apparent, the variation in the optical band gap is hardly recognized at the anneal temperature of within the extent of 200° to 400° C., which is a contrast to the characteristics of the amorphous silicon film produced by the conventional process shown in the broken line (a) of FIG. 2. The thermal stability of the amorphous silicon film of the present invention is due to the smaller amount of hydrogen introduced into the amorphous silicon film, which saturates the dangling bond and places the bond between silicon and hydrogen in the monohydride state. The electric conductivity of the amorphous silicon film of the present invention as a function of the applied anneal temperature is shown in the solid line (b) of FIG. 3. In the amorphous silicon film of the present invention, hydrogen introduced in the amorphous silicon film does not escape due to the heating. Therefore, the electric characteristics are not deteriorated due to the thermal change and the thermally and electrically stable amorphous silicon film which does not increase the mid gap state and maintains the initial electric conductivity can be obtained.

Figure 10:
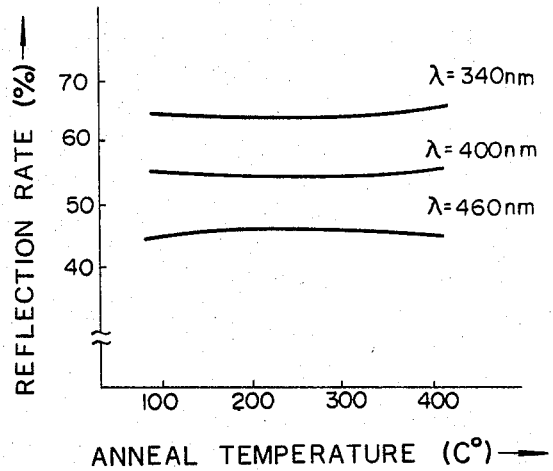
FIG. 10 is a graph of the reflection rate as a function of applied anneal temperature for an amorphous silicon film of the present invention.

Optical characteristics of the amorphous silicon film of the present invention can be evaluated from FIG. 10 in which variation of the reflection rate at the respective anneal temperatures making wave length λ of incident light as a parameter is shown. As is apparent from FIG. 10, the reflection rate is constant irrespective of the anneal temperature, which gives proof of the stability of the amorphous silicon film formed by the process of the present invention.

As explained hereinabove, the process for forming the amorphous silicon film of the present invention is achieved by the cluster ion beam deposition which comprises the step of impinging Si and H upon the substrate in the vacuum vessel into which H$_2$ of the predetermined pressure is introduced, thereby establishing the bond between silicon and silicon while saturating the dangling bond of silicon with H. Accordingly, the bond between silicon and silicon is relatively dominant in the amorphous silicon film, and silicon is bonded with long order as compared with the amorphous silicon film which is obtained by the conventional process. Thus, the indefinite state density of the electrons inherent in the amorphous substances, namely the band tail state, is significantly improved. Moreover, hydrogen (H) migrating on the surface of the substrate together with silicon during the cluster ion beam deposition is bonded to the dangling bond of silicon, thereby eliminating the dangling bond and remarkably decreasing the deep localized level between the bands.

Therefore, the amorphous silicon film produced by the process of the present invention permits the valence electrons to be controlled by doping, although it is formed of the amorphous substance, and is advantageously applicable for producing various semiconductor devices, such as, for example, solar cells, imaging devices, memory elements or various IC elements. The semiconductor device fabricated by the amorphous silicon film of the present invention exhibits excellent characteristics which are not obtainable in the amorphous silicon film formed by the conventional process. Furthermore, the amorphous silicon film does not contain a large volume of hydrogen (H), because the dangling bond of silicon can be eliminated by introducing a small volume of hydrogen (H$_2$). Also, silicon and hydrogen (H) are bonded in the monohydride state which is considered to be stable. Therefore, it is extremely stable and does not cause changes in its electrical and optical characteristics even if it is used in an environment where there is tremendous temperature fluctuation.

Obviously, numerous modifications and variations of the present invention are possible in light of the above teachings. It is therefore to be understood that within the scope of the appended claims, the invention may be practiced otherwise than as specifically described.

What is claimed as new and desired to be secured by Letters Patent of the United States is:

1. A process for forming an amorphous silicon film, comprising the steps of:
    heating and vaporizing silicon in a closed type crucible with at least one injection nozzle to form vapor of silicon;
    ejecting the vapor of silicon through the injection nozzle into an ionization chamber to expand adiabatically the vapor of silicon so as to attain a supercooled state and form clusters comprising atoms of the vapor of silicon;
    ionizing at least one atom forming the clusters by bombarding the clusters with electrons in said ionization chamber to produce ionized clusters;
    introducing hydrogen molecules at a pressure of about 10$^{-3}$ Torr or less into said ionization chamber and concurrent to ionizing of said vapor of silicon ionizing at least some said introduced hydrogen molecules; and
    simultaneously ejecting the ionized clusters and ionized hydrogen from said ionization chamber to collide with a substrate with kinetic energy imparted to the clusters at the time of the ejection from the nozzle thereby forming an amorphous silicon film deposited thereon.

2. The process for forming an amorphous silicon film as defined in claim 1 wherein the substrate is heated at the temperature of less than 500° C.

3. The process for forming an amorphous silicon film as defined in claim 1, wherein the ionized clusters and ionized hydrogen are commonly accelerated by means of an electric field.

4. The process for forming an amorphous silicon film as defined in claim 2, wherein the ionized clusters are accelerated by means of an electric field.

* * * * *